US009244127B2

(12) United States Patent
Wilferd

(10) Patent No.: US 9,244,127 B2
(45) Date of Patent: Jan. 26, 2016

(54) QUICK REFERENCE RELAY DIAGNOSTIC CIRCUIT

(71) Applicant: Randell Lee Wilferd, Pleasant Hill, CA (US)

(72) Inventor: Randell Lee Wilferd, Pleasant Hill, CA (US)

(*) Notice: Subject to any disclaimer, the term of this patent is extended or adjusted under 35 U.S.C. 154(b) by 110 days.

(21) Appl. No.: 13/660,558

(22) Filed: Oct. 25, 2012

(65) Prior Publication Data

US 2013/0106424 A1 May 2, 2013

Related U.S. Application Data

(60) Provisional application No. 61/551,699, filed on Oct. 26, 2011.

(51) Int. Cl.
*G01R 31/327* (2006.01)

(52) U.S. Cl.
CPC ................... *G01R 31/3278* (2013.01)

(58) Field of Classification Search
None
See application file for complete search history.

(56) References Cited

U.S. PATENT DOCUMENTS

| | | | | |
|---|---|---|---|---|
| 5,243,291 A | * | 9/1993 | Umemura | 324/418 |
| 2010/0176830 A1 | * | 7/2010 | Watson | 324/754 |
| 2011/0043369 A1 | * | 2/2011 | Knoop | 340/662 |
| 2011/0228438 A1 | * | 9/2011 | Kohri et al. | 361/187 |

* cited by examiner

*Primary Examiner* — Melissa Koval
*Assistant Examiner* — Courtney McDonnough
(74) *Attorney, Agent, or Firm* — Novak Druce Connolly Bove + Quigg LLP

(57) ABSTRACT

The present invention allows a technician a quick reference diagnostics of an automotive individual electrical circuit by replacement of the OEM relay with a diagnostics relay incorporating a series of LED bulbs designed to illuminate individually upon completion of each internal switching function. Adjacent to an LED is a voltage portal which allows measurement of voltage during each function stage of relay switching.

3 Claims, 3 Drawing Sheets

QUICK REFERENCE RELAY DIAGNOSTIC CIRCUIT

BACKGROUND OF THE INVENTION

1. Field of the Invention

The present invention in general relates to a method and system for the diagnostics of an electrical circuit.

2. Background and Related Art

Today's automotive vehicles have greater dependence upon electrically driven circuits utilized for vehicle drivability and consumer control and comfort. These increased electrical features have placed higher demands on the vehicle's electrical circuitry thus increasing the need for electrical diagnosis. Many operating systems such as on board computers, electronic fuel injection, electrically operated emissions controls and several other current dependent technologies, utilize relay switches to ease the electrical load when switching on or off or when transmitting power to these individual operating systems.

While traditional fuses still play the vital role in electrical load protection the addition of Relays, have reduced much of the electrical burden while providing additional overload protection to the electrical system. In addition, the relay allows a lesser energy input for activation of the requested operating circuit. In order to switch on a individual circuit which sometimes draws more current then may be advisably to pass through the circuit activation switch, a relay is used. The coil of a relay draws very little current for the switching function, (less than 500 milliamps) and the amount of current which can be passed through the relay typically exceeds the amount of current the activation switch can handle. This allows switching of high current devices such as headlights and other high amperage drawing components made possible without damage to the electrical system or the activation switch.

Relays as do fuses have an electrical amperage rating which provides regulation of current flow to the operating system. If the operating system should malfunction due to electrical overloading or shorting, typically both a fuse and the concurring relay are designed to break the circuit thus protecting not only the operating system but the circuit as well.

Typically in most automotive applications, relays are incorporated and mount inside a central sheltered housing within a vehicle.

If failure of the electrical circuit occurs typically a diagnoses by a technician is required in order to detect where and why the system failure. The following invention provides a method and system which provides for the technician a quick diagnostics of the failed circuit.

FIELD OF INVENTION

Accordingly the following invention provides modification to a standard relay internal circuitry to provide a diagnostic testing tool. This invention is used to determine if an OEM relay has failed resulting in the blockage of current flow and preventing the operation or function of an individual electrical component. Further it allows a quick diagnostics of other directly related electrical components within the circuit loop.

Typical construction of the relay includes a housing cover for dust and moisture protection for the internal circuit consisting of an electromagnetic switch coil. When activated current is allowed to flow from the vehicle's electrical system through the relays internal circuit and onto a chosen operating system. When relay or circuit failure occurs, a lack of current results forcing shut down of the operating system.

The present invention consists of a modified relay having a series of indicator lights of LED origin installed in the housing cover and visible to a diagnostic technician. Each individual LED bulb positive pole, (current input side) is connected to an internal terminal which provides a power source to the LED from the relay's internal circuitry. Once the negative side of the LED bulb has been connected to the relay's negative ground circuitry, a complete LED circuit has been formed.

Each LED bulb represents a particular function of the relay and with the bulbs also represented in various colors and illuminate in coordination of each internal function. This bulb activation allows for quick diagnostics of each individual function of the relay and helps to diagnose the problem section within the electrical circuit.

As for example:

The $1^{st}$ LED bulb represents electric current is present at the first relay terminal.

The $2^{nd}$ LED bulb represents electrical current is present at the first and now second terminal.

The $3^{rd}$ LED bulb represents the accessory switch has triggered the relay circuit and is now transferring current to the accessory and where upon transfer, the $2^{nd}$ LED de-energizes.

The present invention provides a technician a quick reference diagnostics of the electrical circuit and also which section of the circuit requires repair.

Other objects, advantages and novel features of the present invention will become readily apparent from the following drawings and detailed description of preferred embodiments.

DETAILED DESCRIPTIONS OF DRAWINGS

The following description of the preferred embodiments is merely exemplary in nature and is in no way intended to limit the invention, its application, or use.

Figure 1:
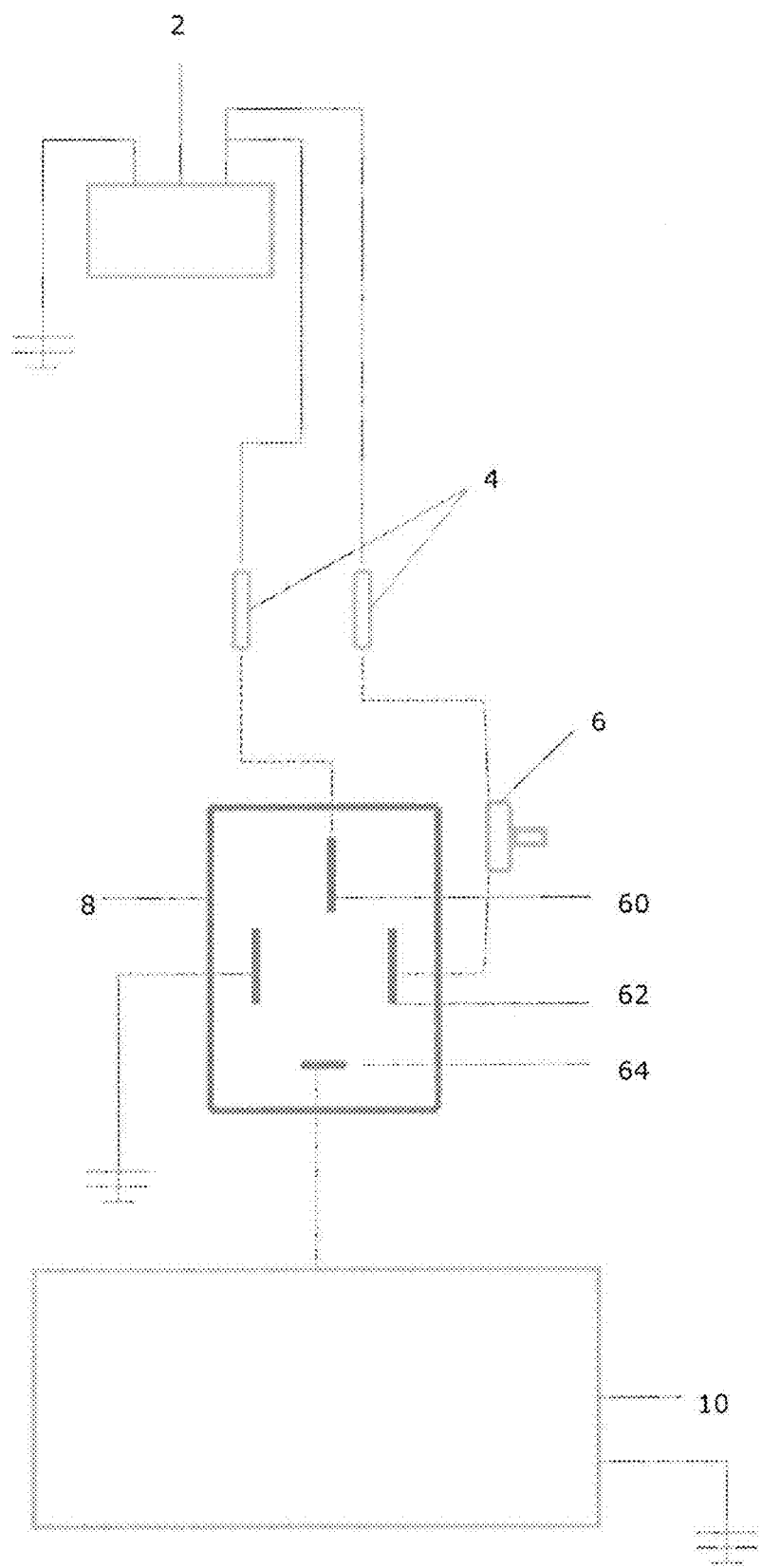
FIG. 1 illustrates an internal automotive circuitry in relationship to an electrical relay.

FIG. 1 illustrates a battery power source 2 which transfers DC electrical power through a series of fuses 4 placed prior to relay 8. Fuses within the circuit provide protection in the event of external circuitry overloading and thus preventing the relay from internal damage. Relay terminal 60 under normal relay operations has constant current present and is the internal provider of current to the relay circuitry. Internally within relay 8 is an electromagnetic coil which functions as a circuitry switch which when activated, transfers current from relay terminal 60 to terminal 62.

A second wire from the battery positive source also transfer's current through a secondary fuse prior to passing through an accessory activation switch 6 which when triggered, transfer's power to relay terminal 62 which when activated, closes the internal electromagnetic coil, allowing completion of the internal relay circuitry.

Activation of terminal 62 provides current transfer to relay terminal 64 which in turn, provides current to accessory 10. Terminals 62 and 64 can not be positively activated at the same time and therefore have to follow a sequence in order to activate or deactivate the accessory.

Figure 2:
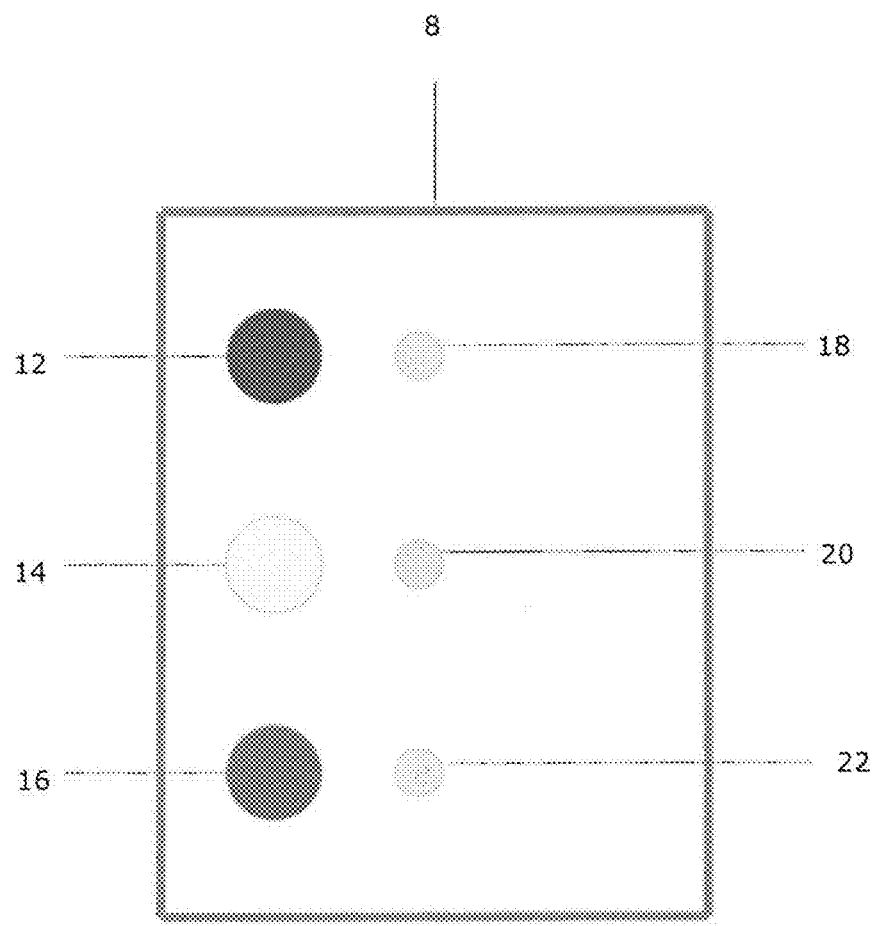
FIG. 2 illustrates a relay LED array and electrical portals.

FIG. 2 illustrates an LED array 12, 14 and 16 used for circuitry diagnostics. The series of LED bulb are of various colors with each representing an individual internal function of the relay. Each LED illuminates in coordination with each function and where when each individual bulb activates, provides a technician a quick reference of the relay function and providing isolation of where the pending problem maybe within the circuit.

As for example, LED bulb 12 represents current is present at relay terminal 60. This informs a technician who is diagnosing the circuit that current from the battery source 2 is passing through fuse 4 to relay 8 and current is present at terminal 60. This would now indicate to the technician this part of the vehicle's circuit is operating as normal and the pending problem is beyond terminal 60.

LED bulb 14 represents electrical current is now present at relay terminal 62. This would further inform a technician that activation switch 6 is functioning and relay 8 has operated to the point of completing its second function of closing the internal electro magnetic coil in order to complete the internal relay circuit.

For example if LED bulb 14 did not light, this would indicate to the technician there could be a potential problem with the activation switch 6 or to the relay it self.

LED bulb 16 represents accessory switch 6 has triggered and the relay circuit is now transferring current to the accessory 10 and where upon transfer, LED 14 is de-energized.

If for example LED bulb 16 did not light could be an indication of a malfunctioning relay and therefore relay 8 should be changed.

Three voltage portals, 18, 20 and 22 are also presented adjacent to the LED's, these portals are used to reference voltage by a technician during each operational stage of the relay. Low voltage readings from any one of the portals could give indication of a short circuiting during the relay function and could provide indication of inconsistencies sometimes experienced during accessory operation.

In the spirit of the present invention explanation, only one individual LED and voltage portal will be explained in FIG. 3 due to circuitry redundancy.

Figure 3:
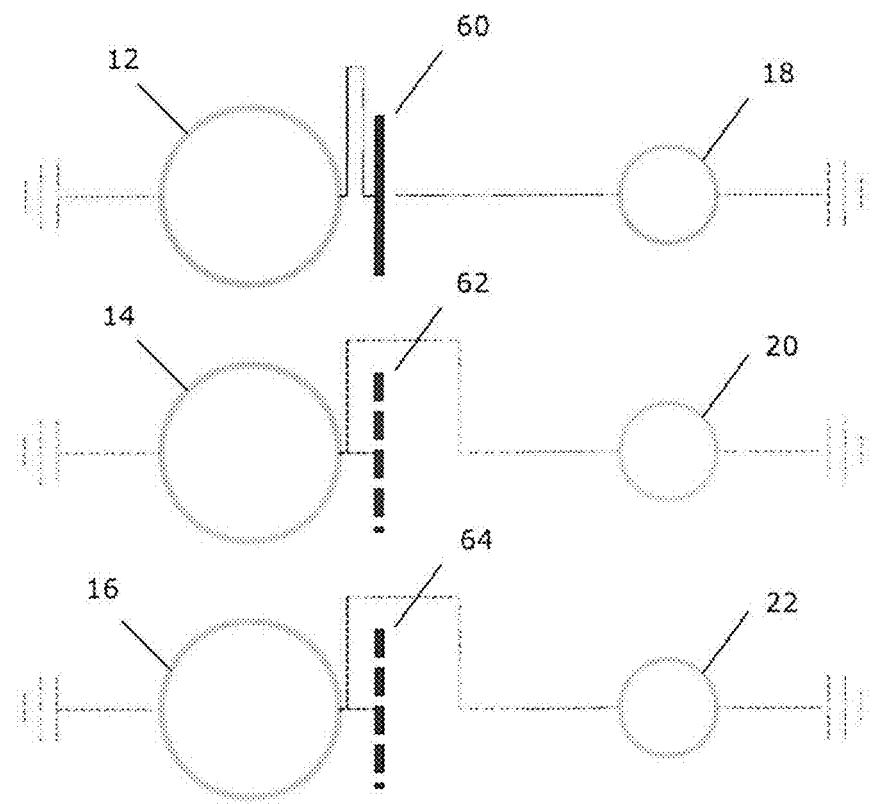
FIG. 3 illustrates modified relay circuitry for the incorporation of the LED bulbs and voltage portals.

FIG. 3 illustrates the internal circuitry of a standard relay when incorporating LED bulbs 12, 14, 16 and voltage portals 18, 20 and 22.

Each LED, 12, 14, 16 and voltage portals 18, 20 and 22 receives positive current input from each terminal they represent and where each of the LED's and portal's are transferred current in sequence of relay terminal function.

As an example LED 14 and voltage portal 20 would only receive current when relay terminal 62 was energized.

Many different relay configurations exist today, however any relay using an internal electrical switching method for "current on or off" can be modified to accept the present method of the invention.

Accordingly, the spirit and scope of the present invention is limited only by the terms of the following claims:

1. A relay diagnostic circuit for an existing automotive electric circuit, said existing automotive electric circuit comprising a DC battery, said diagnostic circuit comprising:
   a test circuit configured to replace an individual OEM relay in a relay socket of an existing automotive electric circuit; said test circuit configuration comprising a series of relay terminals, at least one of said relay terminals configured to receive DC power from the DC battery of the existing automotive electrical circuit, and at least another of said terminals comprising an output relay terminal to transfer the DC power from the at least one relay terminal to an accessory of said existing automotive operating system; a test circuit housing cover for the test circuit, said test circuit housing cover overlying the relay circuit, including the relay terminals, said test circuit housing cover comprising a series of LED bulbs;
   said test circuit comprising an internal switch within said test circuit housing cover;
   said accessory of said existing automotive operating system additionally comprising an accessory switch; said accessory switch providing a separate source of power to an internal switch within the test circuit housing cover when said accessory switch of the existing automotive circuit is activated;
   said internal switch comprising an electromagnetic switch interposed between said at least one relay terminal and the output relay terminal, the electromagnetic switch being responsive to the power provided from said accessory switch, and being electrically connected to a third relay terminal;
   said electromagnetic switch opening or closing a circuit between said at least one relay terminal and the output relay terminal;
   each of said relay terminals configured to be in electrical connection to an individual LED bulb in the test circuit housing cover thereby collectively comprising the series of LED bulbs with an electrical connection between the respective relay terminal and ground;
   said test circuit further comprising a voltage portal in the test circuit housing cover associated with each individual LED bulb to permit measurement of the voltage readings at the portal;
   wherein, when said relay terminals of said test circuit are inserted into the relay socket of said existing automotive circuit, each of said LED bulbs will respectively light if energized by said DC power as its respective relay terminal is connected to the DC power or to the separate source of power when the accessory switch is activated, thereby providing a visual indication of circuit connection or circuit fault.

2. The diagnostic circuit of claim 1, wherein each LED bulb in said series of LED bulbs is visually different.

3. The diagnostic circuit of claim 1, wherein each of the LED bulbs is of a different color.

* * * * *